(12) United States Patent
Sullivan et al.

(10) Patent No.: US 7,804,450 B2
(45) Date of Patent: Sep. 28, 2010

(54) HYBRID ANTENNA STRUCTURE

(75) Inventors: Jonathan L. Sullivan, Lincoln, NE (US); Stefan Lofgren, Stockholm (SE); Ulf Palin, Stockholm (SE)

(73) Assignee: Laird Technologies, Inc., Chesterfield, MO (US)

( * ) Notice: Subject to any disclaimer, the term of this patent is extended or adjusted under 35 U.S.C. 154(b) by 647 days.

(21) Appl. No.: 11/780,964

(22) Filed: Jul. 20, 2007

(65) Prior Publication Data

US 2009/0020328 A1    Jan. 22, 2009

(51) Int. Cl.
*H01Q 1/38* (2006.01)
*H01Q 21/00* (2006.01)

(52) U.S. Cl. .............................. 343/700 MS; 343/893

(58) Field of Classification Search .......... 343/700 MS, 343/893, 895
See application file for complete search history.

(56) References Cited

U.S. PATENT DOCUMENTS

| | | | |
|---|---|---|---|
| 6,018,326 A | 1/2000 | Rudisill | |
| 6,816,127 B2 | 11/2004 | McKivergan et al. | |
| 6,819,287 B2 | 11/2004 | Sullivan et al. | |
| 6,856,294 B2 | 2/2005 | Kadambi et al. | |
| 7,081,855 B2 | 7/2006 | Murray et al. | |
| 7,183,983 B2 | 2/2007 | Ozden | |
| 7,510,985 B1 | 3/2009 | Boenke et al. | |
| 7,651,932 B2 | 1/2010 | Aoki et al. | |
| 2004/0026254 A1 | 2/2004 | Hupe et al. | |
| 2004/0104040 A1* | 6/2004 | Schauz | 174/250 |
| 2005/0205407 A1* | 9/2005 | Hein et al. | 200/600 |
| 2006/0038737 A1 | 2/2006 | Spiropoulos | |
| 2007/0126651 A1 | 6/2007 | Snyder et al. | |
| 2008/0206553 A1 | 8/2008 | Schneider et al. | |
| 2008/0227235 A1* | 9/2008 | Theuss et al. | 438/53 |
| 2009/0009403 A1* | 1/2009 | Sullivan | 343/700 MS |
| 2009/0020328 A1 | 1/2009 | Sullivan et al. | |
| 2009/0065590 A1 | 3/2009 | Aoki et al. | |
| 2009/0297802 A1 | 12/2009 | Sastry et al. | |
| 2010/0009094 A1 | 1/2010 | Lochtman et al. | |
| 2010/0021657 A1 | 1/2010 | Lochtman et al. | |

FOREIGN PATENT DOCUMENTS

| | | |
|---|---|---|
| EP | 1 576 205 B1 | 1/2009 |
| EP | 1 141 776 B1 | 6/2009 |
| EP | 1 926 784 B1 | 1/2010 |
| WO | WO 01/97583 A2 | 12/2001 |

OTHER PUBLICATIONS

Notification of Transmittal of the International Search Report and the Written Opinion of the International Searching Authority, or the Declaration re Application No. PCT/US08/66533 issued on Aug. 22, 2008.

* cited by examiner

*Primary Examiner*—Shih-Chao Chen
(74) *Attorney, Agent, or Firm*—Harness, Dickey & Pierce, P.L.C.

(57) ABSTRACT

An electrical component is provided that provides at least a two shot injection molding structure. One of the at least two shots of plastic comprises a laser direct structuring material. Another of the at least two shots of plastic comprises a non-platable plastic. The laser direct structuring material is selectively activated such that a conductive trace can be plated on the laser direct structuring material.

26 Claims, 6 Drawing Sheets

HYBRID ANTENNA STRUCTURE

BACKGROUND

1. Field

The technology of the present application relates generally to antenna structures and, and more specifically to a hybrid antenna structure combining laser direct structuring material and a two shot molding process.

2. Background

Wireless devices use a variety of different types of antennas. The styles can be classified in two generic categories: external and internal. External antennas are generally more efficient than internal antennas. But internal antennas are less prone to damage and usually more aesthetically pleasing. The technology of the present application generally relates to metalized plastics and has specific utility with electronic components such as internal antennas.

Internal antennas can be made using a number of different methodologies. One method of making internal antennas is a stamped metal or embossing technique. The stamped metal technique uses thin metal that is stamped and formed into the size and shape needed to form the needed radiator design. This piece of metal is then connected to a non-conductive carriage to form the antenna assembly. Another technique used to manufacture antennas is the flexible film approach. This technique uses a thin layer of conductive material such as copper attached to a non-conductive substrate such as Capton or Mylar. The substrate has a thin layer of adhesive on the back surface. To form the radiator geometry, the copper that is not needed is removed by using conventional printed circuit board manufacturing methods. This flexible film is then attached to a rigid structure such as the antenna carriage or the handset housing wall.

One popular method of manufacturing an antenna involves a multi-shot injection molded, selectively plated technique. The multi-shot technique typically provides an injection molded base of non platable plastic with a platable plastic injection molded onto selective portions of the base. The antenna base is formed by a first injection mold process of a base layer or carrier. The base layer typically is a plastic, composite, or synthetic material that has positive strength, durability, and ductility characteristics. However, the base layer also is a non-platable plastic. In other words, conductive traces necessary to form the radiator cannot be adhered or plated to the non-platable plastic. Thus, the base layer is placed into a second injection mold and a platable substrate is molded to the base layer. The platable substrate is typically a plastic, composite, or synthetic material to which conductive traces (most typically copper) can be adhered or plated to form the radiator. Once the base layer and platable substrate layer are formed by the two shot molding process, the structure is plated using, for example, an electroplating technique to plate conductive material to the platable plastic. The conductive material plates substantially all the exposed surface area of the platable plastic to form the radiating structure for the antenna. Generally, the non-platable base and the platable substrate are selected to provide a good mechanical and chemical bond to inhibit the plating process from interfering with the bond between the non-platable and platable parts.

Multi-shot molding, selectively plating methods to form antennas has numerous advantages. For example, the manufacturing of the final design is relatively repeatable and low cost. Other advantages are generally known in the art. However, the process also has numerous disadvantages. For example, the tooling for the process is expensive and the molds frequently need to be changed as the antenna design changes (particularly to accommodate variations in the radiator).

Recently, another popular method of manufacturing an antenna involves using a laser direct structuring process. The laser direct structuring process provides an injection molded base of a material that can be selectively activated by a laser (a.k.a laser drawing on the material). The selectively activated portions of the base are platable. Thus, the laser would be used to selectively activate the material with the radiation pattern desired. The material is plated such that conductive traces plate to the activated portions. One type of material usable for this process is generally known as VECTRA® liquid Crystal polymer from Ticona Engineering Polymers, a business of Celanese, but other materials as a generally know in the art are possible. Generally, a laser direct structuring material includes a plastic that includes a laser sensitive metal complex that may be activated when exposed to the laser light. The metal complex is such that it does not drastically affect the polymer's dielectric properties.

The laser direct structuring method of forming antenna structures also provides numerous advantages. For example, the production is repeatable and flexible. The portion of the material to be activated for the radiator can be varied by reprogramming the laser structure. The laser direct structuring method also has some disadvantages. For example, laser direct structuring material is relatively expensive and has less advantageous material properties.

Thus, against this background, it would be desirable to develop an improved antenna structure.

SUMMARY

Embodiments disclosed herein address the above stated needs by method of forming an electrical component comprising a combination of steps. The steps including providing a first mold to accept a first shot of a first type of plastic and injecting a first shot of the first type of plastic into the first mold provided for the first shot of plastic to obtain a first structural component. Then transferring the first structural component to a second mold to accept a second shot of a second type of plastic and injecting a second shot of the second type of plastic into the second mold provided for the second shot of plastic to couple the first type of plastic to the second type of plastic, the coupling of the first type of plastic and the second type of plastic forming a second structural component wherein at least one of the first type of plastic or the second type of plastic comprises a laser direct structuring material. A laser paints a portion of the laser direct structuring material to activate a portion thereof. The activated portion of the material is plated such that a conductive trace resides on the activated portion.

Other embodiments disclosed herein address the above stated needs by providing an electrical component. The electrical component comprises a first conductive trace carrying section comprising a laser direct structuring material having an activated portion and a non-activated portion coupled to a base section comprising a non-platable plastic. A conductive trace is plated to the activated portion of the conductive trace carrying section.

DETAILED DESCRIPTION

The technology of the present application will now be explained with reference to the figures. The technology of the present application will be described with specific reference to providing a hybrid antenna structure for a wireless device, but one of ordinary skill in the art will recognize on reading the disclosure that the technology may be used in a variety of applications where conductive material is to be plated on a plastic substrate, such as, for example, printed circuit boards or the like. Moreover, the technology of the present application will be explained with reference to particular exemplary embodiments. The word "exemplary" is used herein to mean "serving as an example, instance, or illustration." Any embodiment described herein as "exemplary" is not necessarily to be construed as preferred or advantageous over other embodiments. All embodiments described herein should be construed as exemplary unless otherwise indicated.

Figure 1A:
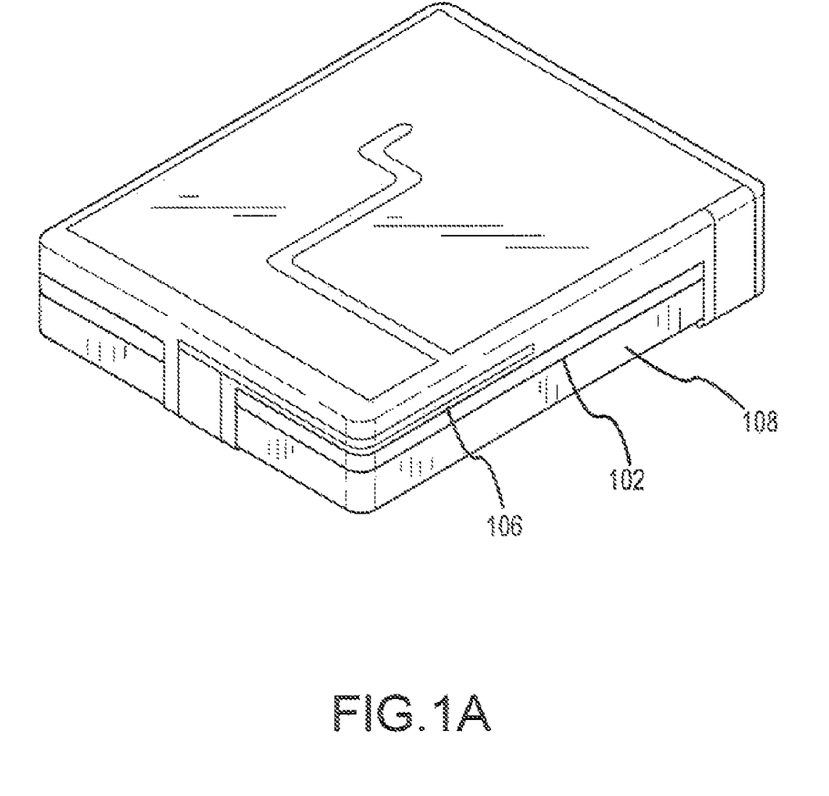
FIG. 1A shows a perspective view of an electronic component using technology associated with the present application.
Figure 1B:
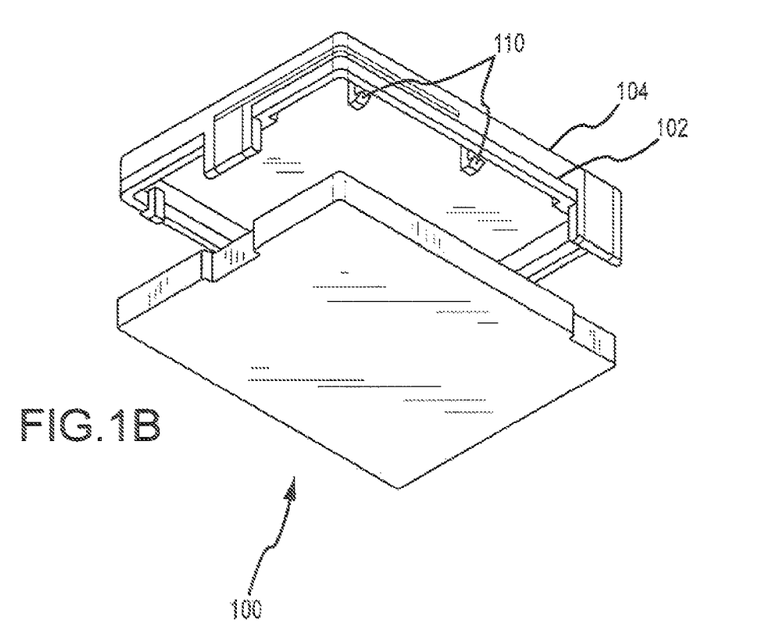
FIGS. 1B and 1C show perspective views of the electronic component of FIG. 1A partially exploded.
Figure 1C:
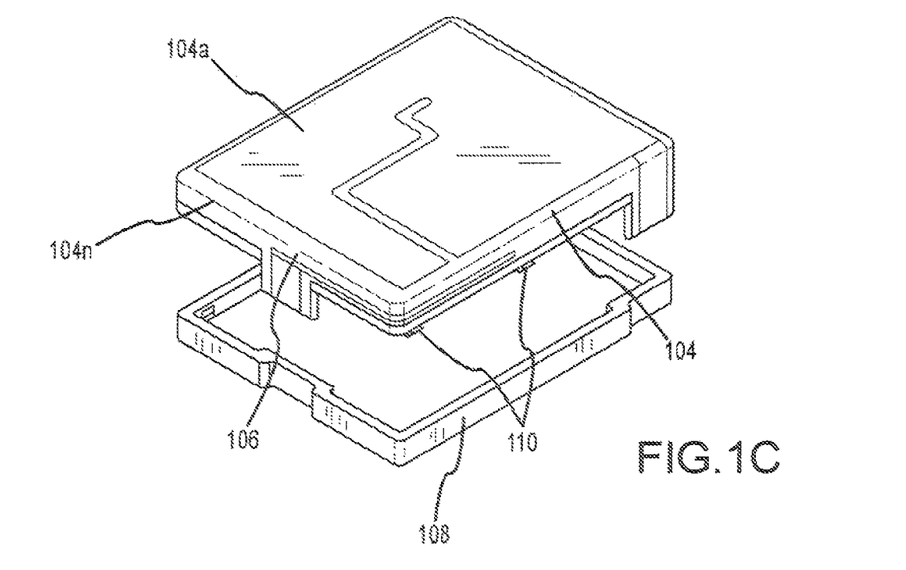

Referring first to FIGS. 1A, 1B, and 1C, an electrical component 100 is illustrated. FIG. 1A shows electrical component 100 in a first perspective view, FIG. 1B shows electrical component 100 in a second perspective view and partially exploded, and FIG. 1C shows electrical component 100 of the first perspective view and partially exploded. Electrical component 100 comprises a base section 102 and a conductive trace carrying section 104. A conductive trace 106 resides on or over an area on conductive trace carrying portion 104. Conductive trace 106 may be contiguous or non-contiguous as shown depending on the design choice and functional requirements of electrical component 100.

Conductive trace carrying section 104 would comprise a laser direct structuring material, such as, for example, VECTRA® Liquid Crystal Polymer or the like described above. Conductive trace carrying section 104 includes an activated portion 104a and a non-activated portion 104n. The activated portion 104a has been painted with a laser as is generally known in the art. Conductive trace 106 is plated onto activated portion 104a using a conventional plating process as will be explained further below.

Figure 2A:
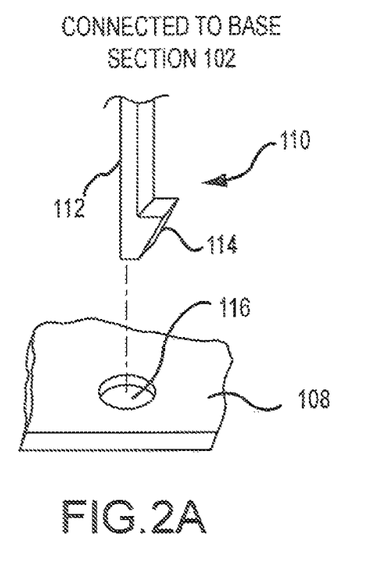
FIGS. 2A-2E show coupling the electrical device of FIG. 1 to a mounting surface.
Figure 2B:
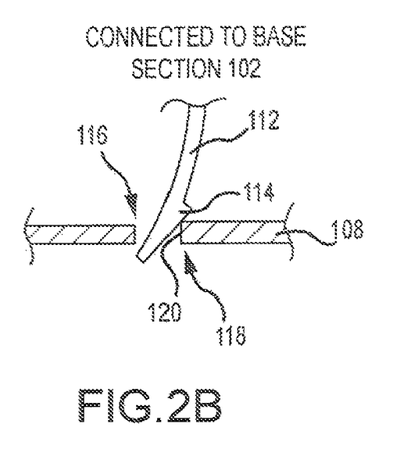
Figure 2C:
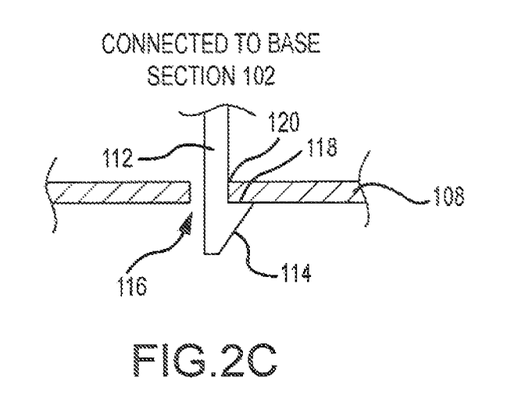

Base section 102 may be coupled to mounting surface 108 as shown in more detail in FIGS. 2A-2E. FIG. 2A shows a perspective view of one prong 110 extend from base 102 towards mounting surface 108. Coupling base section 102 to mounting surface 108 may comprise one or more prongs however. Prong 110 includes a shaft portion 112 and a protrusion portion 114. Protrusion portion 114 may be wedge shaped as shown (a.k.a a cantilever latch system). As shown best in the cross sectional view of FIG. 2B, mounting surface 108 may be a bore 116 with a lip 118 into which prong 110 fits. Wedge shaped protrusion 114 engages an edge 120 of lip 118 causing prong 110 to elastically deform as shown in FIG. 2B. When protrusion 114 extends past lip 118 into bore 116, prong 110 rebounds such that protrusion 114 and lip 118 cause a coupling between base section 102 and mounting surface 108 as shown in FIG. 2C. Bore 116 should be construed broadly to include detents, channels, and through holes whether circular, square or other shapes.

Base section 102 may be coupled to mounting surface 108 as shown in more detail in FIGS. 2A-2E. As shown in FIG. 2A, shows a perspective view of one prong 110 extend from base 102 towards mounting surface 108. Coupling base section 102 to mounting surface 108 may comprise one or more prongs however. Prong 110 includes a shaft portion 112 and a protrusion portion 114. Protrusion portion 114 may be wedge shaped as shown (a.k.a a cantilever latch system). As shown best in the cross sectional view of FIG. 2B, mounting surface 108 may a bore 116 with a lip 118 into which prong 110 fits. Wedge shaped protrusion 114 engages an edge 120 of lip 118 causing prong 110 to elastically deform as shown in FIG. 2B. When protrusion 114 extends past lip 118 into bore 116, prong 110 rebounds such that protrusion 114 and lip 118 cause a coupling between base section 102 and mounting surface 108 as shown in FIG. 2C. Bore 116 should be construed broadly to include detents, channels, and through holes whether circular, square or other shapes.

Figure 2D:
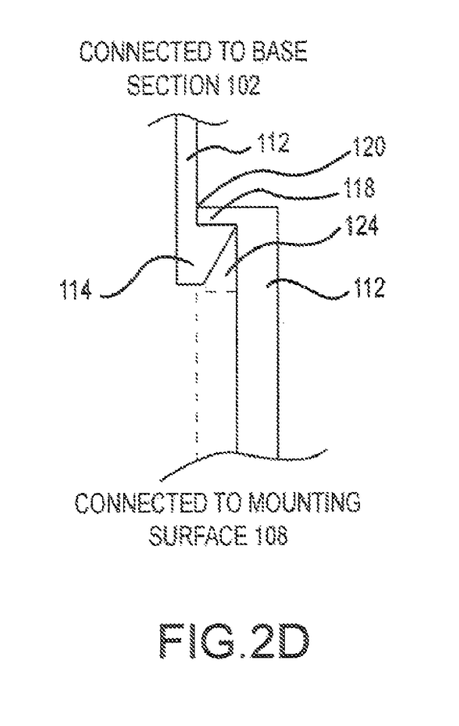

Alternatively as shown in FIG. 2D, mounting surface 108 may have a sidewall 122 with a lip 118. Sidewall and lip 118 would function similarly to the above. Sidewall and lip 118 may form a recess 124 in sidewall into which protrusion 114 may fit as a matter of design choice and as shown in phantom in FIG. 2D.

Figure 2E:
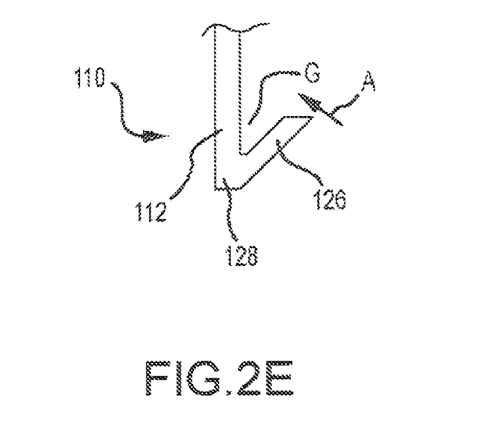

Referring to FIG. 2E another prong 110 is provided. Prong 110 includes a shaft portion 112 and a snap portion 126. Snap portion 126 extends from a base 128 of prong 110 towards base section 102 and removed from shaft portion 112 to provide a gap G between shaft portion 112 and snap portion 124. As snap portion 124 moved past an edge, such as edge 120, snap portion 124 would deform into gap G as shown by directional arrow A. Once extended past the edge, snap portion 124 would return to the undeformed state causing the coupling between base section 102 and mounting surface 108.

As can be appreciated, one advantage of molding base section 102 onto conductive trace carrying section 104 is that base section 102 can be formed from a material more ductile than typical laser direct structuring material. This facilitates the mechanical coupling of the electrical component to the device.

Figure 3:
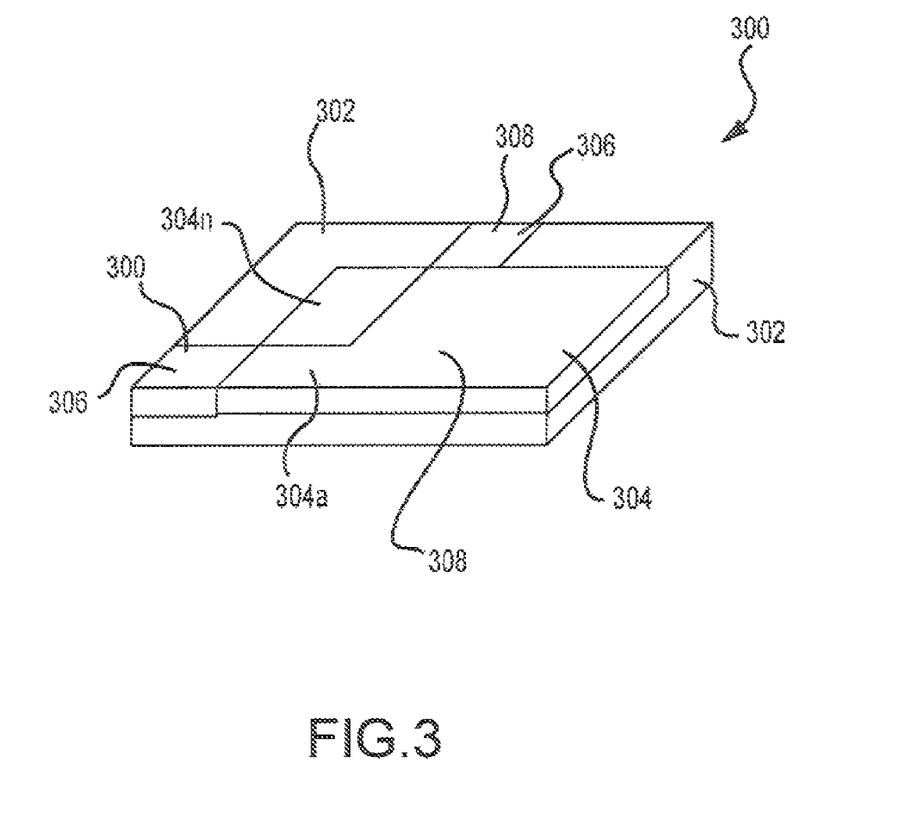
FIG. 3 is a perspective view of an electronic component using technology associated with the present application.

Referring now to FIG. 3, an electrical component 300 is provided. Electrical component 300. Electrical component 300 comprises a base section 302, a first conductive trace carrying section 304 and a second conductive trace carrying section 306. As shown for component 300, there exist multiple second conductive trace carrying sections 306; however, depending on the component design there may be only a single second conductive trace carrying section. Moreover, while only one first conductive trace carrying section 304 is shown, multiple first conductive trace carrying sections 304 are possible depending on the component design. A conductive trace 308 resides on a first conductive trace carrying section 304 and on second conductive trace carrying portion 306. Conductive trace 308 may be contiguous or non-contiguous depending on the design choice and functional requirements of electrical component 300.

First conductive trace carrying section 304 would comprise a laser direct structuring material, such as described above. First conductive trace carrying section 304 includes an activated portion 304a and a non-activated portion 304n. The activated portion 304a has been painted with a laser as is generally known in the art.

Second conductive trace carrying section 306 comprises a platable plastic molded to base section 302. Generally, second conductive trace carrying portion 306 may include portions of the electrical component design unlikely to change for performance characteristics.

First conductive trace carrying section 304 may be a contiguous section as shown or broken into non-contiguous sections as necessary. While all areas likely to carry conductive traces may comprise laser direct structuring material, the use of laser direct structuring material is expensive. Thus, less expensive platable plastics may be used for those portions of the electrical design unlikely to change. Base section 302, first conductive trace carrying section 304, and second conductive trace carrying section 306 may be formed using a three shot molding process. Conductive trace 308 is plated onto activated portion 304a and second conductive trace carrying section 306 using a conventional plating process as will be explained further below.

Base section 102 comprises a conventional plastic used for electrical devices as is generally known in the art. One useful plastic is polycarbon. Base section 102 and conductive trace carrying section 104 may be molded together using a two shot molding process as will be explained further below. Base section 102 couples electrical component 100 to a mounting surface 108. Mounting surface 108 may be any number of conventional structures such as, for example, a housing of an electrical device, a printed circuit board, or the like.

While the above technology can be used with any number of electronic components, using the laser direct structuring material is particularly useful in antenna design. In particular, the specifics of the device and the configuration thereof frequently require the conductive traces associated with the radiator to change in some fashion throughout the product development. Using the laser direct structuring material allows the radiator change to be accomplished via reprogramming the laser to activate alternative portions of the material. Conversely, providing a platable plastic molded to a non-platable plastic as is known with conventional two shot molding selectively plating process requires making a new mold for every change to the radiator design. Thus, the laser direct structuring material provides increased flexibility for the engineers to change the design of the radiator. However, laser direct structuring material does not provide the same beneficial material characteristics to facilitate connection of the electrical component to a device. Thus, providing a base section using, for example, Polycarbon, provides material with more beneficial characteristics, such as, for example, being less brittle, more ductile, stronger, to name but a few examples of different material properties. However, the base material can be chosen based specifically on required material, dielectric, cost, or other characteristics.

Figure 4:
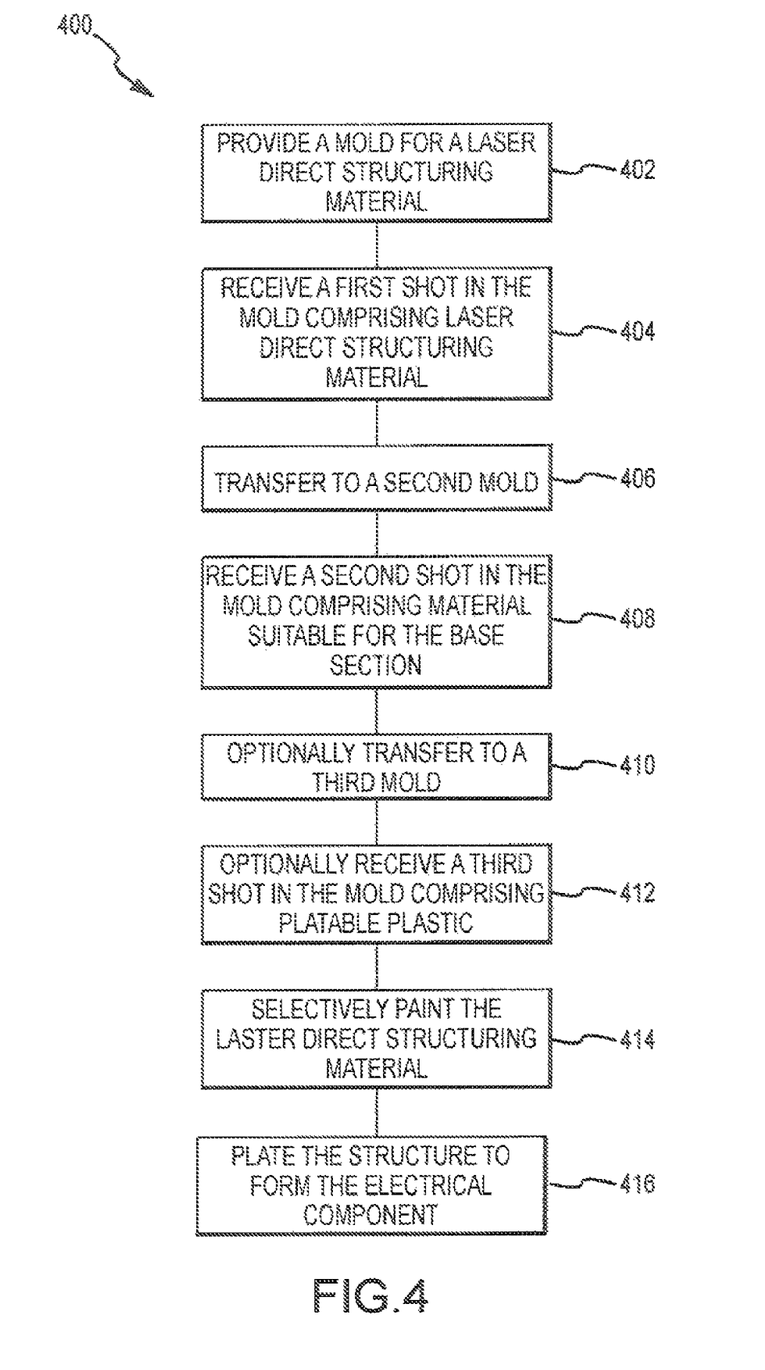
FIG. 4 is an illustrative methodology of making the electronic components of FIGS. 1 and 3.

Referring now to FIG. 4, an exemplary methodology 400 of forming an electrical component using the technology of the present application is provided. While the methodology 400 provides particular steps and actions in a particular order, one of ordinary skill in the art would now recognize on reading the disclosure that the illustrated steps and actions may be performed in alternative order without departing from the spirit and scope of the present invention. First, a laser direct structuring mold is provided, step 402. The laser direct structuring mold receives a first shot of injection molded plastic comprising laser direct structuring material, step 404. The mold should provide a sufficient surface for activation to accommodate the probable radiator design and at least the probable radiator design subject to change. The first shot of injection molding provides a conductive trace carrying section 104 (or first conductive trace carrying section 304 if three or more shots of plastic are provided) described above that is transferred to a second mold, step 406. The second mold receives a second shot of injection molded plastic comprising a suitable plastic for the base section 102 (or base section 302 if three or more shots of plastic are provided) described above, step 408. One conventional base material is polycarbon. The base section plastic should be a non-platable plastic as is generally known in the art. Optionally, electronic component 300 including base section 302 and conductive trace carrying section 304 is transferred to a third mold, step 410. The third mold (step 412) receives a third shot of injection molded plastic comprising a suitable, platable plastic for second conductive trace carrying section, which would be similar to second conductive trace carrying section 306. Next, the laser direct structuring material is selectively activated by a laser, step 414. Finally, the electronic component 100 (or 300) is plated to deposit conductive traces 106 (or 308) on the activated portion 104a of conductive trace carrying portion 104 (or deposited on activated portion 304a and platable plastic 306), step 416.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of forming an electrical component comprising the steps of:
   injecting a first shot of a first type of plastic to obtain a first structural component;
   injecting a second shot of a second type of plastic to couple the first type of plastic to the second type of plastic, the coupling of the first type of plastic and the second type of plastic forming a second structural component wherein one of the first type of plastic or the second type of plastic comprises a laser direct structuring material and the other one of the first type of plastic or the second type of plastic comprises a non-platable plastic;
   painting the laser direct structuring material with a laser to activate a portion of the laser direct structuring material; and
   plating the activated portion of the laser direct structuring material such that a conductive trace resides on the activated portion of the laser direct structuring material.

2. The method according to claim 1, wherein the first type of plastic comprises the laser direct structuring material, and the second type of plastic comprises a non-platable plastic.

3. The method according to claim 1, wherein the non-platable plastic forms an un-plated base section of the electrical component.

4. The method according to claim 1, wherein the method includes:
   injecting the first shot of the first type of plastic into a first mold to obtain the first structural component;
   transferring the first structural component to a second mold; and
   injecting the second shot of the second type of plastic into the second mold to couple the first type of plastic to the second type of plastic.

5. The method according to claim 4, further comprising the steps of:
   transferring the second structural component to a third mold; and injecting a third shot of a third type of plastic to the couple the third type of plastic to at least one of the first type of plastic or the second type of plastic, wherein the third type of plastic comprises a platable plastic and wherein the method includes plating the platable plastic such that the conductive trace resides on the platable plastic and the activated portion of the laser direct structuring material.

6. The method according to claim 1, wherein no platable plastic is used.

7. The method according to claim 6, further comprising the steps of:

transferring the second structural component to a third mold; and injecting a shot of platable plastic into the third mold to the couple the platable plastic to at least one of the laser direct structuring material or the non-platable plastic, wherein the method includes plating the platable plastic such that the conductive trace resides on the platable plastic and the activated portion of the laser direct structuring material.

8. The method according to claim 1, wherein the method includes:

selectively painting the laser direct structuring material; and selectively plating the activated portion of the laser direct structuring material such that the conductive trace has a meandering configuration.

9. The method according to claim 1, wherein the method includes:

activating alternative portions of the laser direct structuring material; and plating the activated alternative portions of the laser direct structuring material, to thereby provide a conductive trace with a different configuration that resides on the activated alternative portions of the laser direct structuring material.

10. The method according to claim 9, wherein activating alternative portions includes reprogramming the laser such that the conductive trace with the different configuration may be provided without having to use a differently configured mold.

11. A method of forming an electrical component comprising the steps of:

injecting a shot of laser direct structuring material to obtain a first structural component;

injecting a shot of non-platable plastic to couple with the laser direct structuring material to form a second structural component;

painting the laser direct structuring material with a laser to activate a portion of the laser direct structuring material; and plating the activated portion of the laser direct structuring material such that a conductive trace resides on the activated portion of the laser direct structuring material.

12. The method according to claim 11, wherein the method includes:

injecting the shot of laser direct structuring material into a first mold to obtain the first structural component;

transferring the first structural component to a second mold; and injecting the shot of non-platable plastic into the second mold to couple with the laser direct structuring material to form the second structural component.

13. An electrical component comprising:

a first conductive trace carrying section comprising a laser direct structuring material having an activated portion and a non-activated portion;

a base section, the base section coupled to the first conductive trace carrying section and comprising a non-platable plastic; and a conductive trace plated to the activated portion of the first conductive trace carrying section.

14. The electrical component according to claim 13, wherein the activated portion comprises a non-contiguous plurality of activated portions.

15. The electrical component according to claim 13, wherein the base section comprises polycarbon.

16. The electrical component according to claim 13, wherein the base section comprises at least one prong to couple the base section to a mounting surface.

17. The electrical component according to claim 16, wherein each of the at least one prongs comprise a shaft portion and a protrusion portion.

18. The electrical component according to claim 16, wherein each of the at least one prongs comprises a shaft portion and a snap portion.

19. The electrical component according to claim 13, further comprising a second conductive trace carrying section comprising a platable plastic and the conductive trace is plated to the platable plastic.

20. The electrical component according to claim 13, wherein the electrical component comprises an antenna.

21. An apparatus comprising:

an electrical component; and a mounting surface coupled to the electrical component, the electrical component comprising:

a first conductive trace carrying section comprising a laser direct structuring material having an activated portion and a non-activated portion, a base section, the base section coupled to the first conductive trace carrying section and comprising a non-platable plastic, and a conductive trace plated to the activated portion of the first conductive trace carrying section.

22. The apparatus according to claim 21, wherein the electrical component further comprises a second conductive trace carrying section comprising a platable plastic and the conductive trace is plated to the platable plastic.

23. The apparatus according to claim 21, wherein the base section comprises at least one prong having a shaft and a protrusion to couple a detent having a lip in the mounting surface.

24. The apparatus according to claim 21, wherein the mounting surface comprises a sidewall having a lip and the at least one prong comprises a shaft and a protrusion where the protrusion couples to the lip.

25. The apparatus according to 24, wherein the sidewall comprises a recess into which the protrusion extends.

26. The apparatus according to claim 21, wherein the apparatus comprises a wireless device and the electrical component comprises an antenna.

* * * * *

UNITED STATES PATENT AND TRADEMARK OFFICE
CERTIFICATE OF CORRECTION

PATENT NO.         : 7,804,450 B2
APPLICATION NO. : 11/780964
DATED                    : September 28, 2010
INVENTOR(S)         : Jonathan L. Sullivan et al.

It is certified that error appears in the above-identified patent and that said Letters Patent is hereby corrected as shown below:

Claim 5
Column 7, line 1: delete "the" after "a third type of plastic to"

Claim 7
Column 7, line 15: delete "the" after "into the third mold to"

Signed and Sealed this

Twenty-first Day of December, 2010

David J. Kappos
*Director of the United States Patent and Trademark Office*